(12) United States Patent
Witzel

(10) Patent No.: US 8,058,875 B2
(45) Date of Patent: Nov. 15, 2011

(54) DETECTION OF GROUND-LAID WIRE USING ULTRAVIOLET C-BAND RADIATION

(75) Inventor: John George Witzel, Alexandria, VA (US)

(73) Assignee: Raytheon UTD, Inc., Springfield, VA (US)

( * ) Notice: Subject to any disclaimer, the term of this patent is extended or adjusted under 35 U.S.C. 154(b) by 316 days.

(21) Appl. No.: 12/538,997

(22) Filed: Aug. 11, 2009

(65) Prior Publication Data

US 2011/0037452 A1 Feb. 17, 2011

(51) Int. Cl.
*G01V 3/08* (2006.01)
(52) U.S. Cl. .......................................... 324/326; 324/67
(58) Field of Classification Search .......... 324/326–329, 324/66, 67; 340/600
See application file for complete search history.

(56) References Cited

U.S. PATENT DOCUMENTS

| | | | |
|---|---|---|---|
| 2,944,152 A | 7/1960 | Johnson et al. | |
| 3,803,463 A | 4/1974 | Cover | |
| 4,253,132 A | 2/1981 | Cover | |
| 4,376,892 A | 3/1983 | Charpak et al. | |
| 4,493,114 A | 1/1985 | Geller et al. | |
| 4,731,881 A | 3/1988 | Geller | |
| 5,021,668 A | 6/1991 | Talmore et al. | |
| 5,062,154 A | 10/1991 | Geller et al. | |
| 5,191,460 A | 3/1993 | Lapatovich | |
| 5,301,051 A | 4/1994 | Geller | |
| 5,307,194 A | 4/1994 | Hatton et al. | |
| 5,381,098 A | 1/1995 | Loftness | |
| 5,430,604 A | 7/1995 | Wong | |
| 5,468,963 A | 11/1995 | Bishop | |
| 5,719,567 A | 2/1998 | Norris | |
| 5,839,024 A * | 11/1998 | May et al. | ........................ 399/89 |
| 6,104,297 A | 8/2000 | Danilychev | |
| 6,954,591 B2 | 10/2005 | Lupton et al. | |
| 2001/0029882 A1 | 10/2001 | Pharo et al. | |
| 2002/0104472 A1 | 8/2002 | Neubert | |
| 2003/0079671 A1 | 5/2003 | Ichikawa et al. | |
| 2003/0150371 A1 | 8/2003 | Snider | |
| 2004/0004826 A1 | 1/2004 | Wakaki et al. | |
| 2004/0089219 A1 | 5/2004 | Burau et al. | |
| 2004/0149199 A1 | 8/2004 | Frank et al. | |

(Continued)

FOREIGN PATENT DOCUMENTS

WO WO 96/38831 12/1996

(Continued)

OTHER PUBLICATIONS

Notification of Transmittal of the International Search Report and the Written Opinion of the ISA, or the Declaration, PCT/US2010/046285, date of mailing Nov. 12, 2010, 1 page.

(Continued)

*Primary Examiner* — Huy Q Phan
*Assistant Examiner* — Alesa Allgood
(74) *Attorney, Agent, or Firm* — Daly, Crowley, Mofford & Durkee, LLP

(57) ABSTRACT

A system for tracing wire includes an electrical exciter adapted to apply a voltage to a ground-laid wire to generate a corona at an outer surface of the ground laid wire, at least a portion of the corona including ultraviolet c-band radiation, and an ultraviolet c-band detector to detect the ultraviolet c-band radiation to trace at least a portion of the path of the ground-laid wire.

22 Claims, 7 Drawing Sheets

U.S. PATENT DOCUMENTS

| | | |
|---|---|---|
| 2005/0078557 A1 | 4/2005 | Andersen |
| 2005/0125926 A1 | 6/2005 | Rekum et al. |
| 2005/0139142 A1 | 6/2005 | Kelley et al. |
| 2005/0160963 A1 | 7/2005 | Siikaluoma et al. |
| 2005/0217558 A1 | 10/2005 | Fitzer et al. |
| 2005/0253927 A1 | 11/2005 | Allik et al. |
| 2005/0270175 A1 | 12/2005 | Peddie et al. |
| 2006/0065183 A1 | 3/2006 | Drummond et al. |
| 2006/0164252 A1 | 7/2006 | Richmond |
| 2006/0169193 A1 | 8/2006 | Mack et al. |
| 2006/0174812 A1 | 8/2006 | Marszalek et al. |
| 2006/0260533 A1 | 11/2006 | Parias |
| 2006/0273087 A1 | 12/2006 | Crawford |
| 2007/0012237 A1 | 1/2007 | Nielsen |
| 2007/0044704 A1 | 3/2007 | Osborne et al. |
| 2007/0098407 A1 | 5/2007 | Hebrank et al. |
| 2007/0119364 A1 | 5/2007 | Taylor et al. |
| 2007/0125296 A1 | 6/2007 | Taylor et al. |
| 2007/0151502 A1 | 7/2007 | Cooperman |
| 2007/0221863 A1 | 9/2007 | Zipf |
| 2007/0253713 A1 | 11/2007 | Reilly et al. |
| 2008/0000411 A1 | 1/2008 | Easterwood |
| 2008/0022920 A1 | 1/2008 | Custodis |
| 2008/0092800 A1 | 4/2008 | Smith et al. |
| 2008/0110391 A1 | 5/2008 | Taylor et al. |
| 2008/0190354 A1 | 8/2008 | Malpas et al. |
| 2008/0315116 A1 | 12/2008 | Schweitzer |
| 2009/0010304 A1 | 1/2009 | Skinner et al. |
| 2009/0145347 A1 | 6/2009 | Nakamura et al. |
| 2009/0178608 A1 | 7/2009 | Shaw et al. |

FOREIGN PATENT DOCUMENTS

| | | |
|---|---|---|
| WO | WO 00/23813 | 4/2000 |
| WO | WO 2007/008738 A1 | 1/2007 |

OTHER PUBLICATIONS

International Search Report, Form PCT/ISA/210, PCT/US2010/046285, date of mailing Nov. 12, 2010, 3 pages.

Written Opinion of the International Searching Authority, PCT/US2010/046285 date of mailing Nov. 12, 2010, 5 pages.

Hamamatsu, Flame Sensor UV Tron ® 2868. "Quick Detection of Flame from Distance, Compact UV Sensor with High Sensitivity and Wide Directivity, Suitable for Flame Detectors and Fire Alarms", 1997 Hamamatsu Photonics K.K., pp. 1-2, http://www.acroname.com/robotics/parts/R66-R2868.pdf, last visited Aug 10, 2009.

"Transforming Law Enforcement Safety X26™ Taser ®" Taser International, Inc., MBR0005 Rev: A, 2009, 2 pages, http://www.taser.com/SiteCollectionDocuments/Downloads/x26_trifold.pdf, 2 pages, last visited Aug 12, 2009.

"DayCor ® Superb Corona Detection Systems Based on UV Solar Blind Technology" http://www.daycor.com/DayCor-Family/P-superb.html, 2 pages, last visited Aug 10, 2009.

"SSD110—Solid State Drive", Plasma Technics Inc.®, 70159_cutsheet, 2 pages, http://www.plasmatechnics.com.

"Installation & Operation Manual SSD110/113 Series" Plasma Technics Inc., Version: Rev 2.2, 2006, 32 pages, http://www.plasmatechnics.com.

U.S. Appl. No. 12/538,997, filed Sep. 4, 2009.

Utility U.S. Appl. No. 12/902,438, filed Oct. 12, 2010, 39 pages.

\* cited by examiner

DETECTION OF GROUND-LAID WIRE USING ULTRAVIOLET C-BAND RADIATION

This invention was made with Government support under Department of the Army Contract No. H94003-04-D-0006 awarded by the United States Army.

FIELD OF THE INVENTION

The inventive techniques and systems generally relate to detecting and tracing wire paths and, in particular, visually detecting ground-laid wire using ultraviolet c-band radiation.

BACKGROUND

As is known in the art, Ultraviolet (UV) light is electromagnetic radiation with a wavelength shorter than that of visible light, but longer than x-rays. UV light includes wavelengths in the range of 100 to 400 nanometers (nm) and energies from 3 to 124 electron-volts. UV light is emitted by the Sun, electric arcs, and artificial light sources such as black lights. As an ionizing radiation, UV sources can cause chemical reactions that cause many substances to glow or fluoresce. Although UV light is beyond visible light, most people are aware of the effects of UV radiation through sunburn. However, the UV spectrum has many other effects, both beneficial and damaging, on human health.

UV radiation can be classified in a number of ways, including as bands of radiation separated into the following:
 UV A-band: 400-320 nm.
 UV B-band: 320-280 nm.
 UV C-band: 280-200 nm.

The Sun emits UV A, UV B, and UV C-band radiation; however, the Earth atmosphere's ozone layer absorbs about 98.7% of this radiation, primarily in the UV B and UV C-bands. Other natural sources of UV radiation include lightning and fires.

As is also know in the art, ordinary glass is partially transparent to UV A-band radiation, but is opaque to shorter UV wavelengths in the UV B and UV C-bands. Silica or Quartz glass, depending on quality of materials, can be transparent to even UV C-band radiation, while window glass passes about 90% of UV light above 350 nm, but blocks over 90% of UV light below 300 nm.

UV radiation can be an effective viricide and bactericide and is used in wastewater treatment. However, it is only beginning to find usage in drinking water sterilization. UV lamps are used to sterilize workspaces and tools used in biology laboratories and medical facilities. In particular, UV light can be an effective germicide because it can prohibit reproduction by damaging cellular DNA, even though it may not kill a host organism.

As is also known in the art, UV C-band radiation is invisible to humans and to ordinary cameras, video gear, and night vision systems. Existing UV detectors generally include either solid-state devices, such as a silicon carbide or aluminum nitride device, or gas-filled tubes as sensing elements. UV detectors are primary used for detecting artificial light. For example, the petrochemical industry uses UV detectors to monitor burning hydrogen flames which radiate strongly in the 185-260 nm range. UV detectors are sensitive to burning compounds, such as hydrocarbons, metals, sulfur, hydrogen, hydrazine, and ammonia. Industrial safety applications employ UV detectors to effectively detect arc-welding, electrical arcs, lighting, and X-rays.

UV C-band detectors are solar blind, since the Earth's atmosphere blocks solar UV C-band radiation, which makes them useful for both indoor and outdoor applications. Furthermore, UV C-band detectors are generally unaffected by night, rain, fog, and dusty environments. Another useful feature is that UV C-band radiation reflects well off soil, pavement, and other manmade surfaces, as well as water. One type of UV C-band detector is a UV C-band camera that includes components such as an image intensifier tube and charge-coupled device (CCD). The tube intensifies electromagnetic energy by converting photons into electrons that dislodge other electrons to produce "intensified" energy captured by the CCD.

SUMMARY

Explosive ordinance disposal (EOD) technicians and qualified military forces need to detect munitions command wires and trace these wires to the point of initiation. Munitions include devices such as bombs, missiles, warheads, ammunition which can be used in combat and/or other attacks to cause injury. EOD forces can physically follow ground-laid command wires to a munitions detonation source to attempt to identify and neutralize hostile forces in the area. However, tracing the ground-laid command wire is a high risk operation with multiple hazards from booby traps, anti-handling devices, and/or enemy attacks.

Furthermore, EOD technicians and support teams may face burdensome obstacles, such as steep grades and heavy brush in hostile territory as they follow the path of the command wire. Some of the dangers may be mitigated by working at night; however, military forces may become disoriented and face dangers from night-time enemy encounters and/or counter-measures.

In general overview, the inventive concepts, techniques, and systems described herein enable remote tracing of ground-laid munitions command wire. In particular, a voltage is applied to a command wire to generate a corona on the wire that includes ultraviolet (UV) C-band radiation that can be detected by a UV C-band detector. Friendly forces can rapidly determine command wire initiation points without venturing from secured positions. Moreover, rapid command wire tracing can enable forces to more quickly locate and neutralize enemy forces that may remain in the area.

In one aspect, a system for tracing wire includes an electrical exciter adapted to apply a voltage to a ground-laid wire to generate a corona at an outer surface of the ground laid wire, at least a portion of the corona including UV C-band radiation. The system also includes an UV C-band detector to detect the UV C-band radiation to enable tracing of an unknown path of the ground-laid wire.

In further embodiments, the system includes one or more of the following features: the ultraviolet c-band detector includes an ultraviolet c-band camera that provides a detection image including a visual scene detection component and a ultraviolet c-band detection component representing at least a portion of the path of the ground-laid wire; the ultraviolet c-band detection component is adapted for viewing in the visual light range; the electrical exciter is an alternating current exciter, a direct current exciter, a plasma exciter, an inverter, a radio-frequency exciter, or a taser ®; the applied voltage is in the range of about 1,000 volts to about 3,000 volts; the wire includes a first conductor and a second conductor and the electrical exciter includes a first terminal coupled to the first conductor and a second terminal coupled to the second conductor; the wire includes a first conductor and the electrical exciter includes a first terminal coupled to the first conductor and a second terminal coupled to ground; the wire further includes a second conductor and the first terminal is further coupled to the second conductor; the wire is command wire for a munitions device, and; the ultraviolet c-band detector is a solid state device, a gas-filled device, or an ultraviolet c-band camera.

In another aspect, a method for tracing a wire includes electrically exciting a ground-laid wire to generate a corona at an outer surface of the ground-laid wire, at least a portion of the corona including UV C-band radiation, and tracing a path of the ground-laid wire by detecting the UV C-band radiation using an UV C-band camera.

In further embodiments, the method further includes one or more of the following features: the ultraviolet c-band detector includes an ultraviolet c-band camera that provides a visual scene detection component and an ultraviolet c-band detection component representing at least a portion of the path of the ground-laid wire; the ultraviolet c-band detection component is adapted for viewing in the visual light range; electrically exciting the wire includes applying a voltage to the wire in the range of about 1,000 volts to about 3,000 volts; the wire includes a first conductor and a second conductor and electrically exciting the wire includes applying a voltage using an electrical exciter including a first terminal coupled to the first conductor and a second terminal coupled to the second conductor; the wire includes a first conductor and electrically exciting the wire includes applying a voltage using an electrical exciter including a first terminal coupled to the first conductor and a second terminal coupled to ground; the wire further includes a second conductor and the first terminal is further coupled to the second conductor; the wire is command wire for a munitions device; the ultraviolet c-band detector is a solid state device, a gas-filled device, or an ultraviolet c-band camera; tracing the wire includes positioning the ultraviolet c-band detector to trace a first portion of the path and positioning the ultraviolet c-band detector to trace a second portion of the path; the first and second portions of the traced path define the entire path of the wire, and; tracing the wire includes tracing the entire path of the wire in a single detection from a detection distance.

It will readily apparent to one of ordinary skill in the art that the inventive concepts, techniques, and systems are not limited to tracing ground-laid munitions command wire to support military and/or anti-terror operations. As by way of non-limiting examples, the inventive concepts, techniques, and systems may be applied to non-military operations, such as tracing ground-laid electrical systems and infrastructures, as well as non-electrical systems with components that can be excited to produce detectible UV C-band coronas.

BRIEF DESCRIPTION OF THE DRAWINGS

The foregoing features, as well as a detailed description, may be more fully understood from the following description of the drawings in which.

DETAILED DESCRIPTION

Before departing on a detailed description of embodiments of the inventive concepts, techniques, and systems described herein, it may be helpful to review ground-laid wire and related components and, in particular, ground-laid munitions command wire and related components. As described herein, ground-laid wire includes wire laid on and/or near the ground. As by way of non-limiting examples, ground-laid wire may include wire laid directly on the ground, such as on the Earth's surface, artificial ground such as roadways and other paved surfaces. Ground-laid wire may also include wire laid near the ground, such as over tree limbs, bushes, leaves, grass, and large exposed rocks. At least a portion of the ground-laid wire may pass through a cave. Furthermore, at least a portion of the ground-laid wire may be suspended off-the-ground, such as wire laid over a gap between two graded surfaces.

Figure 1:
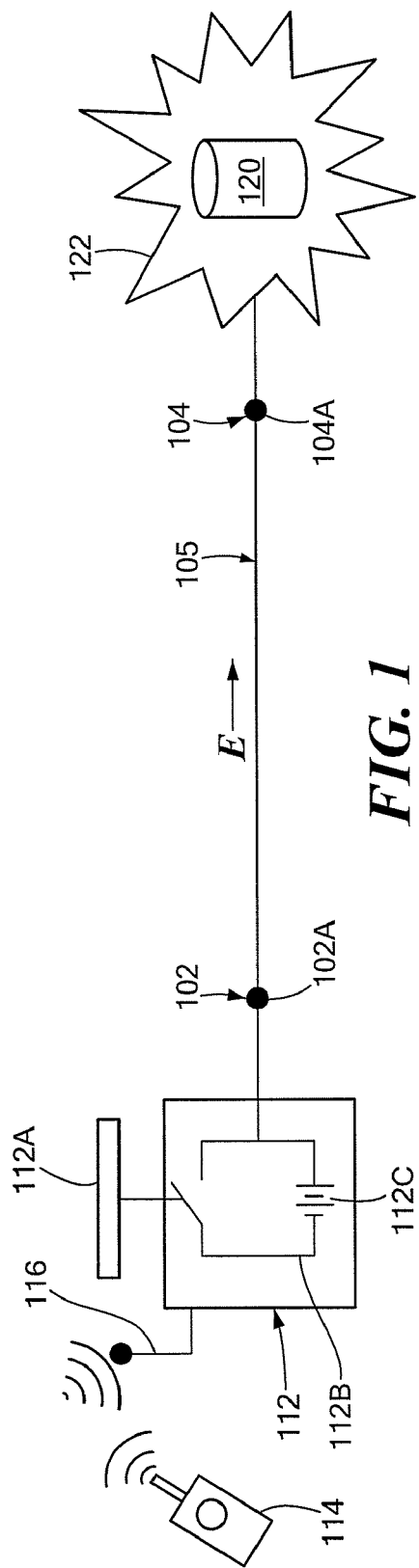
FIG. 1 is a pictorial representation of a munitions device found in the conventional art.

Referring to FIG. 1, a ground-laid wire 105 includes an initiation point 102 and a termination point 104. Here, the ground-laid wire 105 is a command wire for a munitions device 120 and the initiation point 102 is a detonation point 102A from which the munitions device 120 is detonated, and the termination point 104 is an explosive production point 104A at which the munitions device 120 is exploded 122.

A detonation mechanism 112 generates an electrical signal E that is carried over the ground-laid wire 105 from the detonation point 102A to the explosive production point 104A. The explosive production point 104A provides the signal E as an output to munitions circuitry (not shown), which activates the munitions device 120 to produce the explosion 122.

The munitions device 120 can be any explosive device, such as a homemade bomb used in unconventional warfare, and may include conventional military components such as an artillery round. Terrorists, guerrillas, and/or commando forces may construct and deploy the munitions device 120 in military theaters or non-military settings. The munitions device 120 may be triggered using a mechanical mechanism 112A, such as a handle or button that closes a circuit 112B powered by an electrical storage device 112C such as a battery, and provides the voltage signal E as an output to the command wire 105. Alternatively, the munitions device 120 may be triggered using a remote control device 114 that communicates a signal to a receiver 116 to activate the detonation mechanism 112 and output signal E. Still further, the munitions device 120 may a road-side bomb triggered by a passing object (such as a vehicle) that produces a force on the munitions device 120 to activate the detonation circuit and initiate the explosion 122. Other triggering methods may be used such as trip wires.

Figure 2:
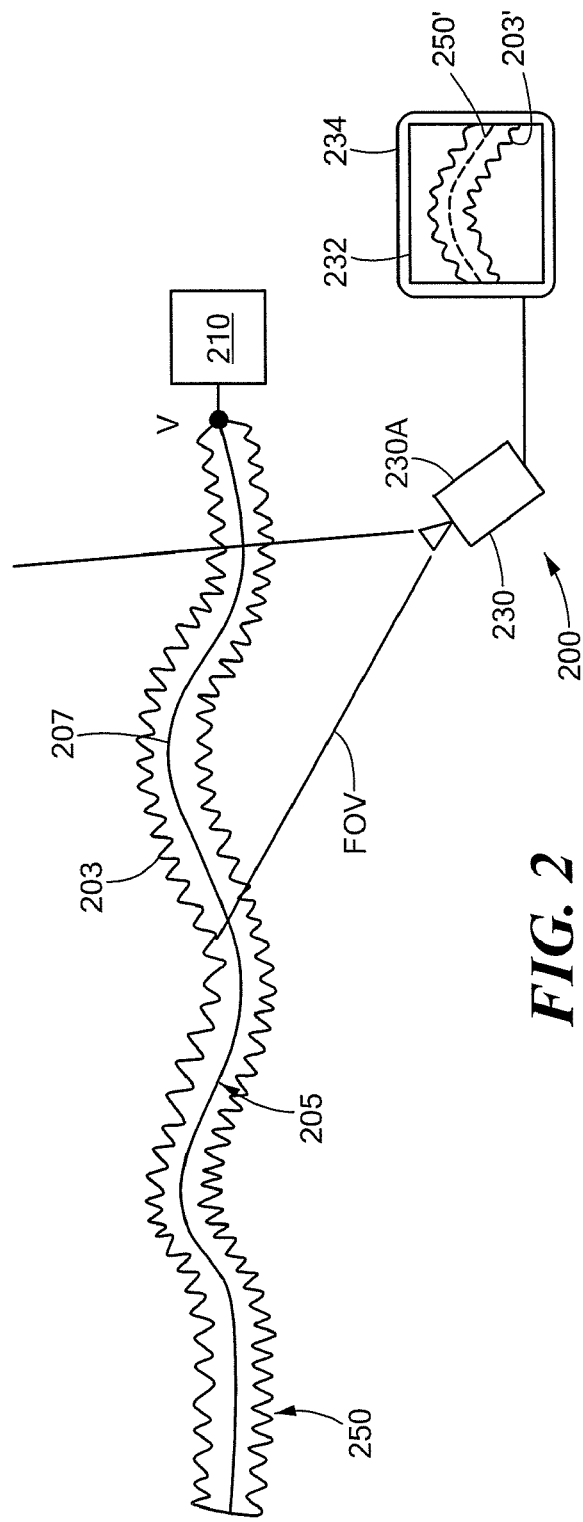
FIG. 2 is an embodiment of an inventive system described herein for tracing a path of a ground-laid munitions command wire.

Referring now to FIG. 2, in accordance with the inventive concepts, systems, and techniques described herein, a system 200 includes an electrical exciter 210 adapted to apply a high-gradient voltage V to a ground-laid wire 205 capable of generating a corona 203 at an outer surface 207 of the ground-laid wire 205. At least a portion of the corona includes ultra-violet (UV) C-band radiation. The system 200 includes an UV C-band detector 230 to detect the UV C-band radiation to enable tracing of a path 250 of the ground-laid wire 205. The path of the wire 250 may be unknown; however, the system 200 may also be used to trace known or at least partially known command wire paths to, for example, verify a path of a command wire and/or to trace one or more missing portions of the path 250. In other applications, the system 200 may be used to trace an unknown portion of a path of a command wire from a known point on the path before a munitions device is exploded to attempt to thwart the explosion, such as by deactivating and/or decommissioning the device.

The electrical exciter 210 includes a device capable of providing a voltage over the wire 205 to generate the corona 203. As non-limiting examples, an electrical exciter may include an alternating current exciter, direct current exciter, a plasma exciter, an inverter, a radio-frequency exciter, or a taser®. In a further embodiment, the exciter 210 provides a voltage V in the range of about 1,000 volts to about 3,000 volts.

A corona is an electro-static discharge, frequently luminous, at the surface of a conductor or between two conductors, accompanied by ionization of the surrounding atmosphere and often by a power loss. More particularly, as described herein, a corona 203 includes an electro-magnetic discharge generated at the outer surface of the wire 205. At least a portion of the corona 203 includes UV C-band radiation in the range of about 200 nanometers (nm) to about 280 nm.

Command wire excitation generates the corona. UV C-band emission can occur when excited Nitrogen molecules ($N_2$) return to a ground state and emit a photon. One way $N_2$ molecules can be excited is by exposing them to high electrical voltage gradients. Both positive and negative gradients may produce excited $N_2$ molecules.

The UV C-band radiation detector 230 includes a device capable of detecting light, including light in the UV C-band radiation range. As non-limiting examples, a detector 230 may include a solid state device, such as a silicon carbide or aluminum nitride device, or a gas-filled tube.

Other non-limiting examples include a one-bit UV C-band detector, such as the UVTron R2868 manufactured by Hamamatsu Photonics K. K. of Iwata-City, Shizuoka Pref., Japan, capable of detecting light in the range of about 185 nm to about 260 nm. In still other examples, a detector 230 includes a UV C-band imager, a non-limiting example of which is the DayCor © Superb manufactured by Ofil Ltd. of Nes-Ziona, Israel, which is a sensitive bi-spectral visible light and UV C-band detection apparatus with absolute solar blind performance and with high pinpointing resolution.

In one embodiment, the detector 230 is a UV C-band camera 230A that generates an image 232 on a display device 234. The display device 234 may include a video monitor and/or an in-camera view-finder. The image 232 displays the UV C-band radiation detected within a field-of view (FOV) of the camera 230A. As can be seen in FIG. 2, a detected corona 203' will be produced along a visual path 250' that generally corresponds of the path of the wire 250. In one embodiment, the image 232 displays a black background and a contrasting color, such as white, to represent the detected corona 203'.

It should be noted that although FIG. 2 shows the UV C-band detector 230 and electrical exciter 210 as separate components, in one or more embodiments a single structural unit can encompass the detector 230 and exciter 210. In such an arrangement, the electrical exciter 210 may be coupled to the ground-laid wire 205 over a relatively long terminal to enable remote detection of the corona 203.

Figure 3A:
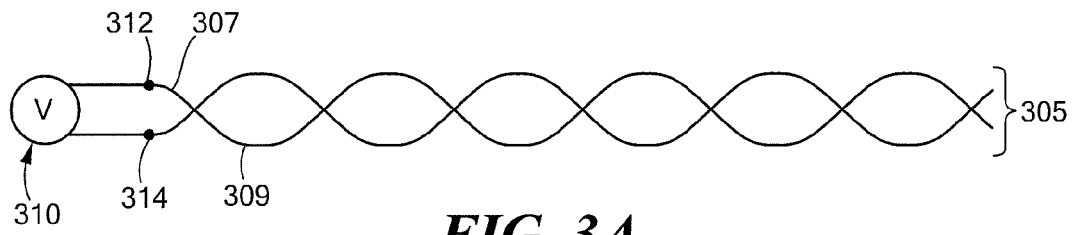
FIG. 3A is a pictorial representation of an embodiment of an electrical exciter coupled to a command wire according to the inventive concepts, techniques, and systems.

Referring to FIG. 3A, in a further embodiment a ground-wire 305, as may be similar to ground-wire 205 described in conjunction with FIG. 2, includes a first conductor 307 and a second conductor 309, and an electrical exciter 310, as may be similar to electrical exciter 210 described in conjunction with FIG. 2. The electrical exciter 310 includes a first terminal 312 coupled to the first conductor 307 and a second terminal 314 coupled to the second conductor 309. In still a further embodiment, the first and second conductors 307, 309 are twisted.

Figure 3B:
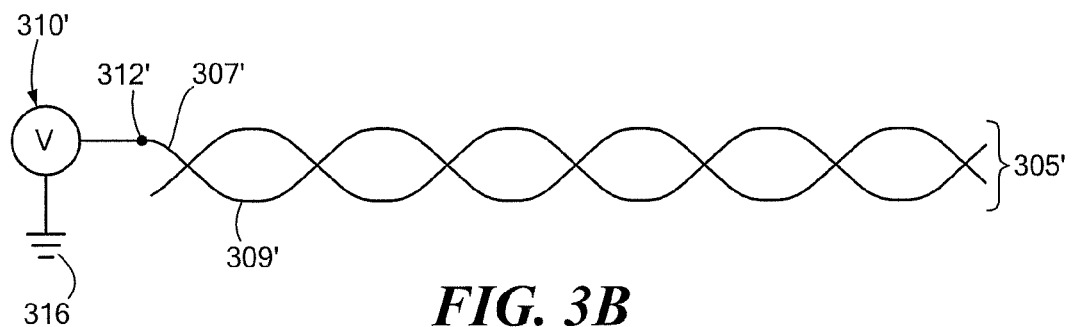
FIG. 3B is a pictorial representation of another embodiment of an electrical exciter coupled to a command wire according to the inventive concepts, techniques, and systems.

Referring now to FIG. 3B, in a further embodiment a ground-wire 305', as may be similar to ground-wire 205 described in conjunction with FIG. 2, includes a first conductor 307' and a second conductor 309', and an electrical exciter 310', as may be similar to electrical exciter 210 described in conjunction with FIG. 2. The electrical exciter 310' includes a first terminal 312' coupled to the first conductor 307'.

In the same or different embodiment, the electrical exciter 310' is connected to ground 316. For example, a conductor such as a metal rod may be connected to the electrical exciter 310' and inserted into the ground or soil.

Figure 3C:
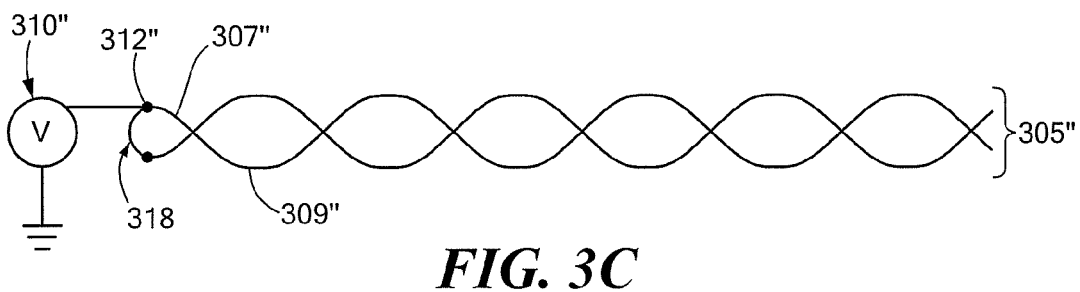
FIG. 3C is a pictorial representation of a further embodiment of an electrical exciter coupled to a command wire according to the inventive concepts, techniques, and systems.

Referring now to FIG. 3C, in a further embodiment a ground-wire 305", as may be similar to ground-laid wire 205 described in conjunction with FIG. 2, includes a first conductor 307" and a second conductor 309", and an electrical exciter 310", as may be similar to electrical exciter 210 described in conjunction with FIG. 2. The electrical exciter 310' includes a first terminal 312" coupled to the first conductor 307". The first terminal 312" is further coupled to the second conductor 309" via conductor 318.

It should be noted that the ground-laid wire 205 may include a plurality of conductors, such as in a multi-conductor cable. Still further, the ground-laid wire 205 may include a stainless steel cable, metal-based fencing material, or any other material capable of carrying a current.

Figure 4:
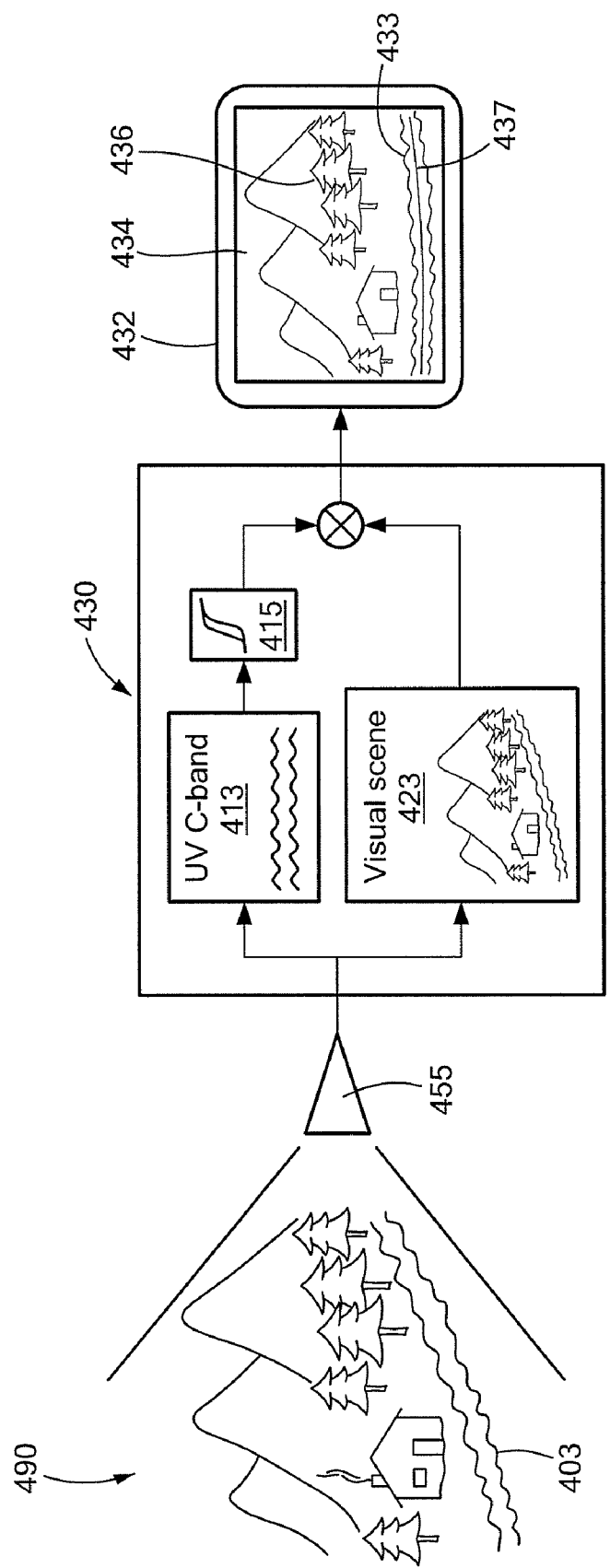
FIG. 4 is a pictorial representation of an embodiment of an ultraviolet (UV) C-band imager of the type which may be used in the system of FIG. 2.

Referring now to FIG. 4, in a further embodiment the inventive concepts, techniques, and systems include an imager 430 capable of detecting UV C-band radiation 403 and visible light present within an environment 490. The imager 430 generates an image 434 on a display device 432 that includes the detected UV C-band radiation 433 and the visual scene of the environment 423. In this embodiment, the detected UV C-band radiation 413 represents a corona generated by an exciter, as may be similar to exciter 210 described in conjunction with FIG. 2, over a command wire for a munitions device. The imager 430 may include objective UV and/or zoom lenses, mirrors, and other components, generally denoted by reference numeral 455.

In a further embodiment, a detected UV C-band image 413 is transformed 415 to appear as a visual component 433 of the displayed image 434 which may overlap other displayed objects 436 within the environment 490. In this way, a user can trace the path of a command wire. In still a further embodiment, a plurality of UV C-band detections is processed to calculate and render a line of best fit 437 representing an approximate path of the wire. A variety of methods may be used for computing a best fit and/or a trend-line from defined points including, but not limited to, a linear regression model using the least squares approach. Here, the defined points represent detected UV C-band radiation and because very few objects emit such radiation, the resulting line of best fit 437 will correlate rather accurately with the path of the wire.

Figure 5:
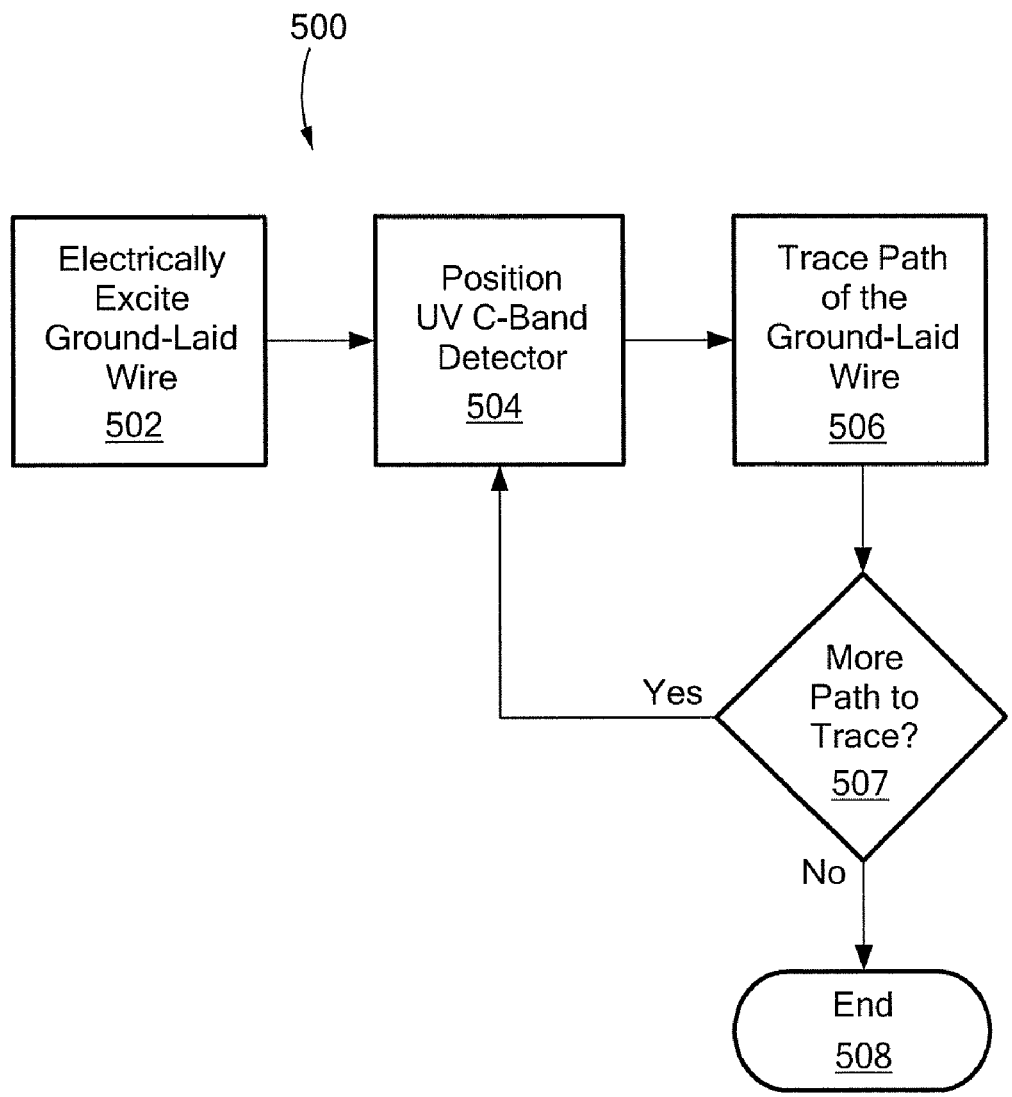
FIG. 5 is a flow diagram of an embodiment of an inventive method described herein for tracing a ground-laid munitions command wire.

Referring now to FIG. 5, a method 500 for tracing a ground-laid wire includes electrically exciting the wire to generate a corona at an outer surface of the wire 502, the corona including UV C-band radiation, and tracing a path of the ground-laid wire using an UV C-band detector to detect the UV C-band radiation 506. In a further embodiment, the method 500 includes positioning the UV C-band detector 504 to detect a first portion of the wire. If the first portion of the wire represents the entire path of the wire, then the method 500 may be terminated 508. Otherwise, the method 500 further includes re-positioning the UV C-band detector 504 to trace a second portion of the wire.

Figure 6A:
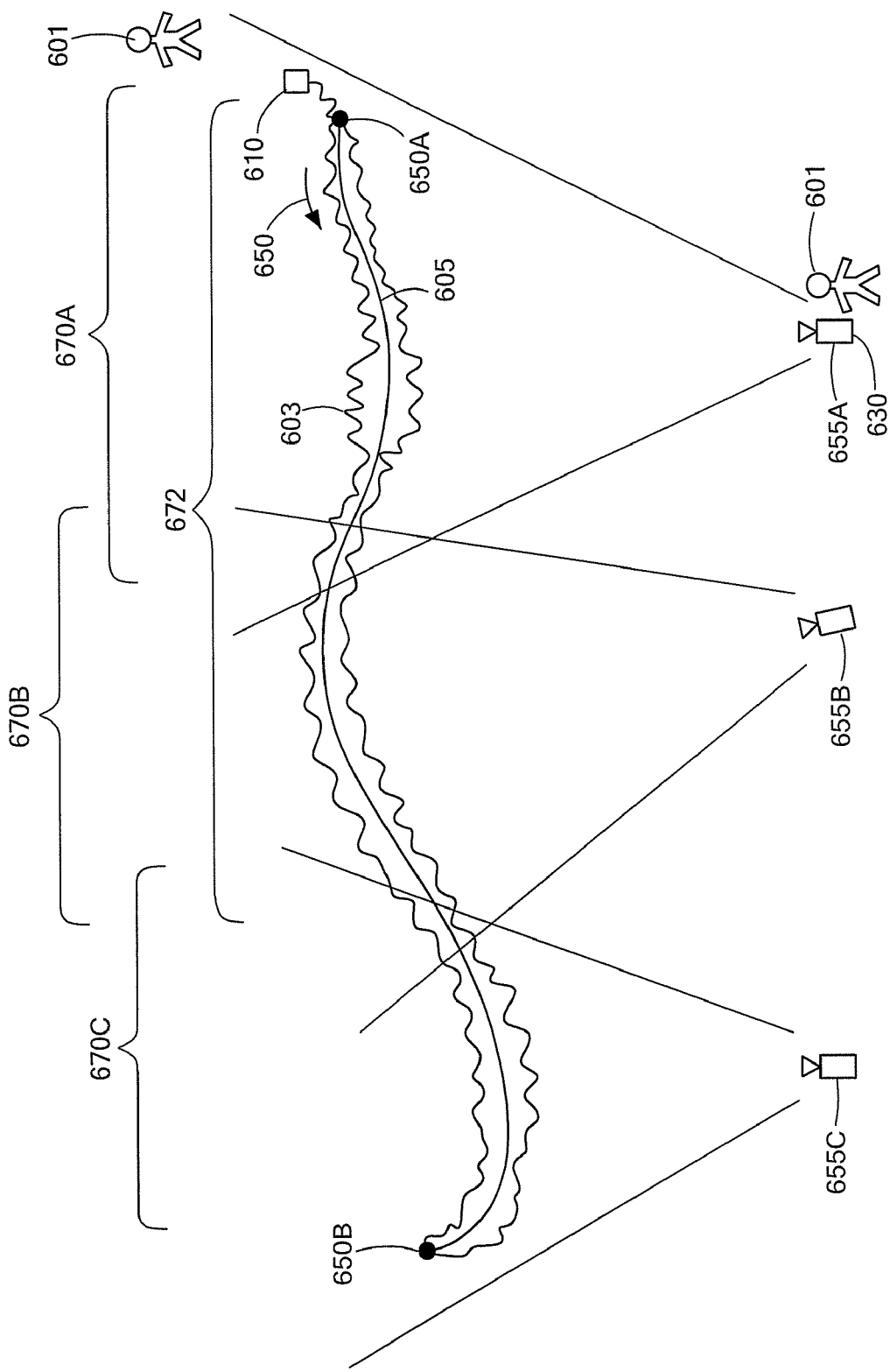
FIG. 6A is pictorial representation of an embodiment of positioning of a UV C-band detector for tracing portions of a path of a command wire.

Referring now to FIG. 6A, in still a further embodiment the method includes positioning the UV C-band detector 630 a number of times (i.e. two, three, or N times) to trace a number of portions (generally denoted by reference numeral 670) of a path of a wire 650 until a desired portion of a path of a wire 672 is traced. In the same or different embodiment, the desired portion of the path of the wire includes the entire path 650 of the ground-laid wire 605 from a starting point 650A to an ending point 650B.

It will be understood by one of ordinary skill in the art that the traced portions may or may not overlap. Tracing overlapping portions may help ensure that portions of the path of the wire are not missed during tracing operations and, therefore, may help avoid tracing errors. However, it may be possible and may be quicker to trace non-overlapping portions of the path of the wire and to fill-in missing gaps by extrapolating between the non-overlapping portions.

In exemplary applications incorporating the inventive concepts, techniques, and systems, a first user 601 couples an electrical exciter 610, as may be similar to electrical exciter 210 (and embodiments thereof) described in conjunction with FIG. 2, to the first end 650A of the ground-laid wire 605 to generate a corona 603 over the surface of the wire 605, as may be similar to corona 203 described in conjunction with FIG. 2. In a further embodiment, the first user 601 is a robotic device autonomously capable of performing the coupling task. In still another embodiment, the robotic device is remotely controlled by a human operator. In yet another embodiment, the robotic device is provided coordinates for the first end 650A of the ground-laid wire 605.

The first user 601 positions an UV C-band detector 630 at a first position 655A to detect and trace a first portion 670A of the ground-laid wire 605. The first user 601 re-positions the detector 630 at a second position 655B to detect a second portion 670B of the ground-laid wire 605. The first user 601 may further re-position 655C the detector 630 until the first user 601 traces the entire path of the wire 650 from the starting point 650A to the ending point 650B, or a portion of the path of the wire.

Figure 6B:
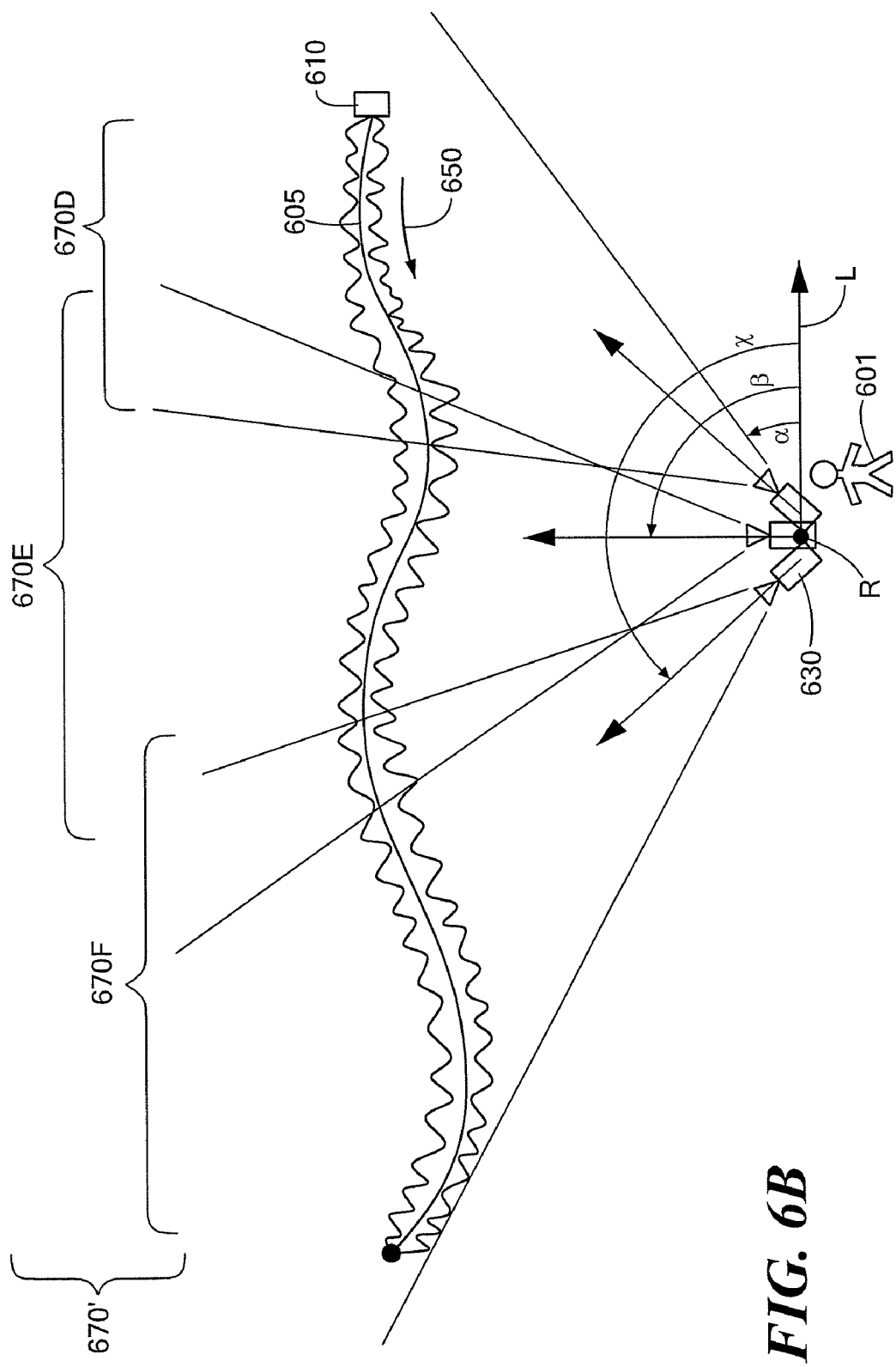
FIG. 6B is pictorial representation of another embodiment of positioning of a UV C-band detector for tracing portions of a path of a command wire.

Referring now to FIG. 6B, in other exemplary applications the first user 601 positions the detector 630 by rotating it about an axis R to trace one or more portions 670' of the path of the wire 650. For example, the first user 601 traces a first portion 670D of the path of the wire 650 by rotating the detector 630 a first angle α about axis R. First angle α is measured from a line L perpendicular to axis R (and in the plane of the paper) and generally parallel to the path of the wire 650. The first user 601 traces respective second portion 670E and third portion 670F (and/or up to N portions) of the path of the wire 650 by rotating the detector 630 respective second angle β and third angle χ.

Figure 6C:
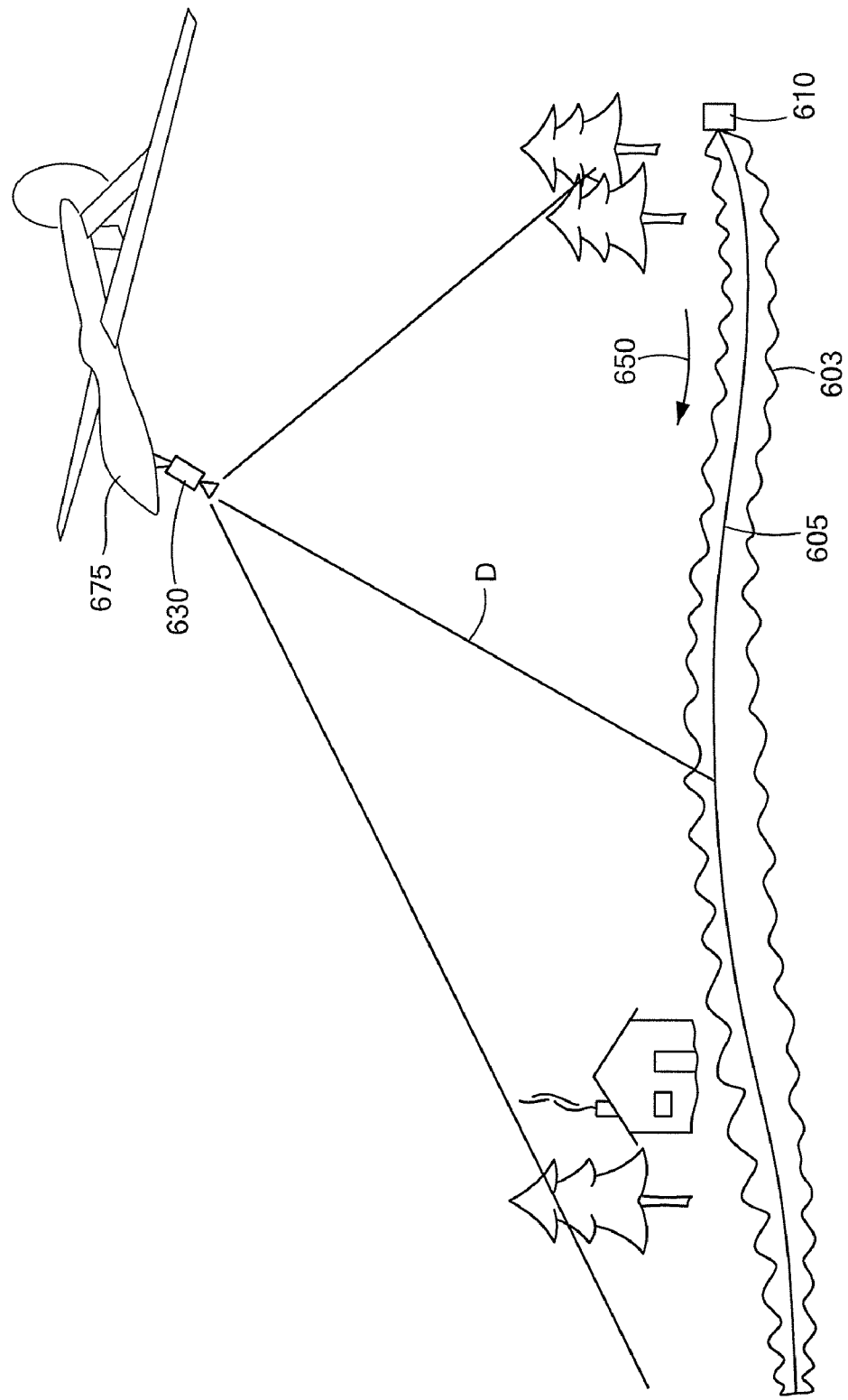
FIG. 6C is pictorial representation of an embodiment of the inventive concepts, systems, and techniques in which a UV C-band detector is positioned at a sufficient distance from the command wire to enable the entire path of the command wire to be traced in a single operation.

Referring now to FIG. 6C, in a further embodiment tracing the wire 605 includes tracing the entire path of the wire 650 in a single trace operation from a detection distance D. Distance D is any distance from which the entire path of the wire may be detected. Distance D will depend on various factors, such as the length of the wire, and obstacles that may impede the wire at certain positions from the wire. Other factors may affect the distance D such as the aperture of a camera detector and/or sensitivity of the detector and/or the intensity of the corona. As by way of a non-limiting example, a detector 630 may be mounted on an aircraft 675 to detect a corona 603 generated by an exciter 610 over the entire path of the ground-laid wire 650. The aircraft 675 may include, but is not limited to, a drone aircraft, helicopter, fighter jet, balloon, etc.

It should be noted that in some exemplary applications incorporating the inventive concepts, techniques, and systems, the first user 601 includes a plurality of users including an exciter user who sets up the exciter to generate the corona over the command wire and a detector user who operates the UV C-band detector to detect and trace the path of the wire 650. In the same or different embodiment, a first user and a second user operate different UV C-band detectors to trace different portions of the path of the wire. The first and second users may perform the task simultaneously. The detected UV C-band radiation from each of the UV C-band detectors may be integrated to enable viewing as a single image. Such an arrangement may facilitate ground-laid munitions command wire tracing for relatively long command wires, such as 300 meters in length. Furthermore, such simultaneous tracing by a plurality of UV C-band detectors may enable quicker tracing the path of the command wire to enable a quicker response to munitions detonation events.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A system for tracing wire, comprising:
    an electrical exciter adapted to apply a voltage to a ground-laid wire to generate a corona at an outer surface of the ground laid wire, at least a portion of the corona including ultraviolet c-band radiation; and
    an ultraviolet c-band detector to detect the ultraviolet c-band radiation to trace at least a portion of the path of the ground-laid wire.

2. The system of claim 1, wherein the ultraviolet c-band detector includes an ultraviolet c-band camera that provides a detection image comprising:
    a visual scene detection component; and
    a ultraviolet c-band detection component representing at least a portion of the path of the ground-laid wire.

3. The system of claim 2, wherein the ultraviolet c-band detection component is adapted for viewing in the visual light range.

4. The system of claim 1, wherein the electrical exciter is an alternating current exciter, a direct current exciter, a plasma exciter, an inverter, a radio-frequency exciter, or a taser.

5. The system of claim 1, wherein the applied voltage is in the range of about 1,000 volts to about 3,000 volts.

6. The system of claim 1, wherein the wire includes a first conductor and a second conductor and the electrical exciter includes a first terminal coupled to the first conductor and a second terminal coupled to the second conductor.

7. The system of claim 1, wherein the wire includes a first conductor and the electrical exciter includes a first terminal coupled to the first conductor and a second terminal coupled to ground.

8. The system of claim 7, wherein the wire further includes second conductor and the first terminal is further coupled to the second conductor.

9. The system of claim 1, wherein the wire is command wire for a munitions device.

10. The system of claim 1, wherein the ultraviolet c-band detector is a solid state device, a gas-filled device, or an ultraviolet c-band camera.

11. A method for tracing a wire, comprising:
   electrically exciting a ground-laid wire to generate a corona at an outer surface of the ground-laid wire, at least a portion of the corona including ultraviolet c-band radiation; and
   tracing at least a portion of a path of the ground-laid wire by detecting the ultraviolet c-band radiation using an ultraviolet c-band detector.

12. The method of claim 11, wherein the ultraviolet c-band detector includes an ultraviolet c-band camera that provides a visual scene detection component and an ultraviolet c-band detection component representing at least a portion of the path of the ground-laid wire.

13. The method of claim 12, wherein the ultraviolet c-band detection component is adapted for viewing in the visual light range.

14. The method of claim 11, wherein electrically exciting the wire includes applying a voltage to the wire in the range of about 1,000 volts to about 3,000 volts.

15. The method of claim 11, wherein the wire includes a first conductor and a second conductor and electrically exciting the wire includes applying a voltage using an electrical exciter including a first terminal coupled to the first conductor and a second terminal coupled to the second conductor.

16. The method of claim 11, wherein the wire includes a first conductor and electrically exciting the wire includes applying a voltage using an electrical exciter including a first terminal coupled to the first conductor and a second terminal coupled to ground.

17. The method of claim 16, wherein the wire further includes second conductor and the first terminal is further coupled to the second conductor.

18. The method of claim 11, wherein the wire is command wire for a munitions device.

19. The method of claim 11, wherein the ultraviolet c-band detector is a solid state device, a gas-filled device, or an ultraviolet c-band camera.

20. The method of claim 11, wherein tracing the wire includes:
   positioning the ultraviolet c-band detector to trace a first portion of the path; and
   positioning the ultraviolet c-band detector to trace a second portion of the path.

21. The method of claim 20, wherein the first and second portions of the traced path define the entire path of the wire.

22. The method of claim 11, wherein tracing the wire includes tracing the entire path of the wire in a single detection from a detection distance.

* * * * *